United States Patent [19]

Le Ny et al.

[11] Patent Number: 4,518,818

[45] Date of Patent: May 21, 1985

[54] ENCAPSULATING CASE ABLE TO RESIST HIGH EXTERNAL PRESSURES

[75] Inventors: Jacques Le Ny; Christian Val, both of Paris, France

[73] Assignee: Thomson-CSF, Paris, France

[21] Appl. No.: 557,256

[22] Filed: Jan. 4, 1984

Related U.S. Application Data

[63] Continuation of Ser. No. 274,205, Jun. 16, 1981, abandoned.

[30] Foreign Application Priority Data

Jun. 19, 1980 [FR] France ................................. 80 13596

[51] Int. Cl.³ .............................................. H05K 5/06
[52] U.S. Cl. .................................. 174/52 FP; 357/74
[58] Field of Search ........................ 174/52 FP, 52 S; 357/74; 361/399; 405/185; 114/312

[56] References Cited

U.S. PATENT DOCUMENTS

| 3,404,215 | 10/1968 | Burks et al. | 174/52 FP |
| 3,436,775 | 4/1969 | Schlosser et al. | 174/110 F |
| 3,450,082 | 6/1969 | Demarest, Jr. | 114/312 |

Primary Examiner—R. L. Moses
Assistant Examiner—D. A. Tone

[57] ABSTRACT

An encapsulating case or box for hybrid circuits, able to operate in highly pressurized atmosphere, the components of the hybrid circuit being not subject to the action of pressure. For this purpose, said circuit is enclosed in a case taking the plane of the hybrid circuit substrate as the plane of symmetry, two half-shells made from an electrically insulating rigid material being arranged in symmetrical manner on the two faces of the substrate for creating a zero deformation area within the case. The electrical connections between the hybrid circuit and the connecting pins, outside the case and supported by the substrate are provided by flat metal conductors passing in the gluing plane to the substrate of a half-shell.

7 Claims, 4 Drawing Figures

ENCAPSULATING CASE ABLE TO RESIST HIGH EXTERNAL PRESSURES

This is a continuation of application Ser. No. 274,205, filed June 16, 1981, abandoned.

BACKGROUND OF THE INVENTION

The present invention relates to an encapsulating case or box more particularly intended for hybrid circuits required to operate under high, uniform and hydrostatic pressures.

In the case of low level measurements it is known that amplification electronics must be located as close as possible to the sensor or transducer so as to be able to transmit an amplified signal, which is less disturbed by noise or local interference. Although this is easy to bring about at pressures close to atmospheric pressure it becomes difficult when the pressure of the medium in which the circuit has to operate is high and exceeds, for example, 100 bars.

Thus, the components of hybrid circuits are not normally intended to operate under high pressures and the pellets of integrated circuits or semiconductors, the capacitors and resistors connected to a hybrid circuit substrate break at pressures above a few bars, as does the actual substrate.

Non-limitative examples of circuits operating under high pressures are those submerged at a depth of two or three thousand meters or circuits introduced into presurized industrial installations, e.g. for measuring flows or pressures.

The generally adopted solution consists of enclosing the electronic circuit in a metal case, which is often round or cylindrical, intended to resist the external pressure. One example is constituted by a "glove finger" which penetrates an industrial installation, but which is not applicable to a circuit submerged under several thousand meters of water. In this case the connection by cable requires the metal case to be provided with so-called "glass/metal" passages, i.e. metal connections sealed in the case by glass beads. However, this type of seal and these passages are very fragile.

BRIEF SUMMARY OF THE INVENTION

The invention provides a solution for this double problem of the operation of a hybrid circuit under a high pressure and to its electrical connections with the outside, by proposing a hermetic case constituted by a thin, planar substrate, the hybrid circuit being formed on one or both faces and to which are connected two convex enveloping covers without sharp angles and which face one another so as to grip the substrate. Furthermore the substrate projects beyond the perimeter of the covers making it possible to fix thereto external connecting pins, which are electrically connected to the hybrid within the case by metal tracks of limited thickness deposited on the said substrate and which pass between the latter and the cover in the thickness of the sealing joint. The two covers are sealed with the substrate by any known means, excellent results being obtained with an epoxy glue on an alumina member.

The present invention more specifically relates to an encapsulating case which is able to resist high external pressures for a hybrid circuit made on a planar substrate formed from a ceramic material, wherein it is firstly constituted by two identical half-shells made from an electrically insulating, rigid material and having a convex shape with no sharp angles and having an internal concavity of dimensions adapted to the circuit to be protected, said half-shells being arranged symmetically on the two faces of the substrate of the hybrid circuit, thus creating within the case an unpressurized area with a zero deformation and secondly the electrical connections between the hybrid circuit and the external connecting pins are provided by flat, thin metal conductors deposited on at least one face of the substrate and which traverse the encapsulating case in the plane of the sealing joint of one half-shell on the substrate.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
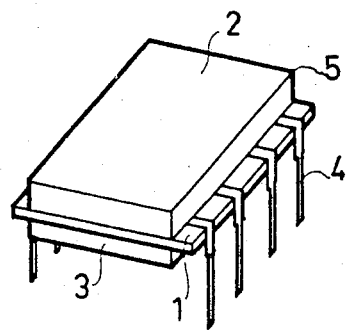
FIG. 1 a ceramic hybrid circuit case for resisting an external pressure.

FIG. 1 shows a hybrid circuit case, viewed in space, with its adaptation for resisting an external pressure. The actual hybrid circuit is deposited on a substrate plate 1 and is protected by a first cover 2 from one side of the substrate plate and by a second cover 3 from the other side of the substrate plate, the said covers 2 and 3 facing one another. The external connections are formed by a known type of pin 4. The most commonly encountered hybrid circuits are square or rectangular and as a result the covers 2 and 3 are themselves square or rectangular and adapted to the hybrid circuit.

Although this type of microbox or external protection is suitable for low pressures, it does not provide an adequate resistance when the pressures rise and reach e.g. 100 bars, because there is then an accumulation of stresses in the sharp angles 5 of the covers, which are disconnected and crushed by the pressure.

Figure 2:
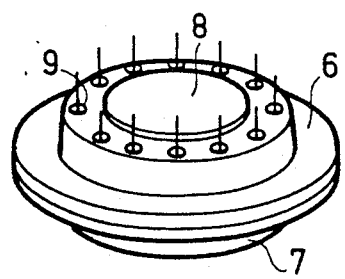
FIG. 2 a metal hybrid circuit case.

FIG. 2 shows another hybrid circuit case, which attempts to solve the problems due to high pressures. This type of case is based on the metal cases used for power transistors and comprises two metal half-shells 6, 7 offering a good resistance and e.g. of stainless steel or titanium, said half-shells being peripherally welded. One of the half-shells, 6 in FIG. 2, corresponds to the base of a power transistor. The hybrid circuit, which is hidden in the drawing because it is located within the case, is welded to the central part 8 thereof. The other half-shell, 7 in FIG. 2, corresponds to the power transistor case cover. The electrical connections with the outside are provided by means of output terminals, which are electrically insulated and sealed in the half-shell 6 by means of glass beads.

This represents an adaptation of hybrid cases in a known encapsulation, which causes no problems for the hybrid circuits when operating at atmospheric pressure, but which must e.g. be protected from corrosion by a tightly sealed case. However, in the case of high pressures, e.g. 200 to 400 bars, problems are encountered in connection with the resistance of the glass/metal passages or the glass beads 9.

Moreover, this adaptation of a known case has the industrial disadvantage of necessitating a machining of the half-shells, a polishing of the contacting surfaces for welding and the use of costly materials and processes, which in many cases lead to prohibitive costs.

Figure 3:
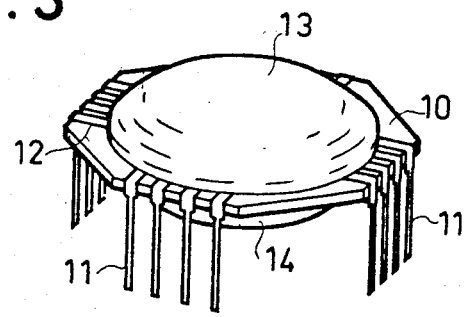
FIG. 3 a view in space of a further embodiment of the hybrid circuit case according to the invention provided with its pressure resistant covers.

FIG. 3 is a view in space of the hybrid circuit encapsulating case according to the invention. The hybrid circuit, which is intended to operate at high pressures, is produced on a substrate plate 10 according to the prior art. The actual hybrid circuit connectors are joined to outer connecting pins 11 by means which will be developed subsequently and which involve the use of metal strips deposited on substrate 10. The encapsulating case according to the invention consists inter alia of joining to the two main faces of substrate 10 two half-shells or covers 13 and 14, which are identical, convex and free from sharp angles. These covers are fixed on either side of the substrate in such a way that the pressure exerted on the latter, level with the joint, by one of the covers is cancelled out by the pressure exerted on the other cover. Thus, the central part of the substrate is within the case and outside the high pressure area.

The circular shape of each of the covers 13 and 14 is best adapted to the pressure resistance, because all the forces are equally distributed perpendicular to the cover wall. Moreover, the radius of curvature of each of the covers is matched to the pressure to be withstood. This convex curvature can be relatively limited for pressures e.g. of approximately 50 bars, whilst it can reach a hemispherical shape for much higher pressures.

As the substrate of a hybrid circuit is conventionally made from alumina or a ceramic material, the two covers 13 and 14 are also advantageously made from alumina or a ceramic material like that of the substrate in such a way that the mechanical and thermal characteristics are identical.

The thickness of each of the two members serving as covers is adapted to the pressure to be withstood. In all cases it is sufficient on the edge of the covers coming into contact with the substrate 10 to permit a seal, either directly by means of glue, or via a seal provided by welding, which then requires insulating joints to prevent the weld from causing short-circuiting between the connecting tracks 12.

The round shape of each of the covers calls for the substrate to be square. In actual fact the square shape although possible is not advantageous, because the substrate then has four curvilinear triangles which are fragile. An octagonal shape has proved to be particularly advantageous because on the one hand it makes it possible to fix the output pins 11 to between one and eight sides if necessary, said pins then being aligned on each of the sides, which corresponds to the traditional positioning of the pins. On the other hand the octagonal shape makes it possible to construct the substrates more easily in that they are cut either by laser or by scratching in a square shape from an alumina plate and whose four corners are then cut again to give octagons. This octagonal shape is consequently more advantageous from the industrial standpoint than a square or circular shape which is difficult to produce. Within its size the octagon inscribes in a very satisfactory manner the circular shape of the covers.

Figure 4:
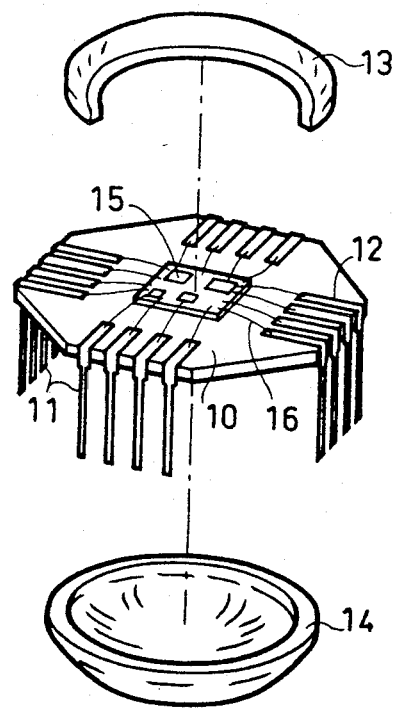
FIG. 4 an exploded view of a hybrid circuit according to the invention shown in FIG. 3 with its two covers.

FIG. 4 is an exploded view of the same hybrid circuit as in FIG. 3 located in its high pressure resistant case.

This drawing better shows the substrate 10 to which the hybrid circuit pellet 15 is welded in the conventional known manner for hybrid circuits with external connecting pins 11 by using thin, flat metal strips 12 by means of connecting wires 16. The metal strips 12 are shown in rectilinear form, but their design can differ and can be adapted to the connection requirements of hybrid circuit 15. In the same way hybrid circuit 15 can be joined to pins 11 and to the metal terminals 12 by a collective welding system of the TAB type, i.e. by a collective weld using a film for an automatic transfer to a strip.

FIG. 4 also shows, on the basis of a half-shell 13, the shape of the half-shells used as the upper and lower cover for the high pressure resistant case according to the invention.

It is firstly possible to see the internal concavity of half-shell 13 corresponding to the volume of the hybrid circuit which is to be protected against the pressure, whilst it is also possible to see the thickness of the edge of said half-shell. According to the invention the thickness of each half-shell 13, 14 has a double function. Firstly the sealing of half-shells 13, 14 to substrate 10 is effected by the edge thereof and is ensured by means of a joint with a glue surface necessary for ensuring that the glue can resist the effect of the external pressure. Furthermore the two half-shells work in force opposition on either side of the substrate and if they were too thin it could happen that as a result e.g. of poor glueing of the two not precisely facing half-shells that the substrate would shear and break. Moreover, if the half-shells were thin the glue film by which they adhere to the substrate would not be adequate to resist the external pressure exerted on the glue joint. However, as the metal conductive strips 12 are thin a very limited glue thickness is adequate to ensure the sealing and glueing of the half-shells to the substrate. A thickness of a few dozen microns is very adequate and provides an adequate resistance during pressure tests.

The outer connecting terminals 11 shown in FIGS. 3 and 4 are metal pins of a type frequently encountered in hybrid circuits. However, they do not form part of the actual invention and can be replaced by any other system suitable for the particular use of the hybrid circuit, such as a connection by a wire directly welded to the metal strips 12 or by a multiple connector connection.

FIG. 4 only shows a hybrid circuit mounted on one face of the substrate 10. However, if the number of outer connections permits it and if this is necessary, two hybrid circuits can be mounted respectively on each of the substrate faces and the outer pins are divided up between those which are joined to a first hybrid circuit on a first face of the substrate via a certain number of metal strips 12 on said substrate face and those which are joined to a second hybrid circuit on the second substrate face by means of other metal strips 12 located on the other substrate face.

The invention is not limited to the embodiments described and represented hereinbefore and various modifications can be made thereto without passing beyond the scope of the invention.

What is claimed is:

1. An encapsulating case which is able to resist high external pressures for a hybrid circuit made on a planar substrate formed from a ceramic material, wherein it is firstly constituted by two identical half-shells made from an electrically insulating, rigid material and having a convex shape with no sharp angles and having an internal concavity of dimensions adapted to the circuit to be protected, said half-shells being arranged symmetrically on the two faces of the substrate of the hybrid circuit, thus creating within the case an unpressurized area with a zero deformation and secondly by electrical connection means between the hybrid circuit and external connecting pins outside of the case, the electrical connection means including flat, thin conductors deposited on at least one face of the substrate which have thicknesses in the micron range to be thinner than the thickness pf sealing joints so that the electrical connection means will traverse the encapsulating case in the thickness of the sealing joint to be in the plane of the sealing joint of one half-shell on the substrate.

2. An encapsulating case according to claim 1, wherein the two half-shells have a convex, circular shape.

3. An encapsulating case according to claim 1, wherein the two half-shells have a convex, oval shape.

4. An encapsulating case according to claim 1, wherein the two half-shells having the same diameter have smaller dimensions than the substrate, which is divided up into two areas, namely an area within the case which is free from pressure and which carries the hybrid circuit and the inner part of the conductors and an area outside the case which is subject to pressure action and which carries on its periphery connecting pins and the outer part of the conductors.

5. An encapsulating case according to claim 1, wherein the mechanical and thermal characteristics of the substrate and the two half-shells are identical, said substrate and case being made from an electrically insulating rigid material, such as alumina.

6. An encapsulating case according to claim 1, wherein the thickness and convex curvature of the two half-shells are adapted to the external pressure.

7. An encapsulating case according to claim 1, wherein the two half-shells are assembled to the substrate by glueing by means of an epoxy glue, which has an electrically insulating action and ensures the sealing at the conductors.

* * * * *